(12) United States Patent
Kawazu

(10) Patent No.: US 9,805,995 B2
(45) Date of Patent: Oct. 31, 2017

(54) ELEMENT-ACCOMMODATING PACKAGE AND MOUNTING STRUCTURE

(71) Applicant: KYOCERA Corporation, Kyoto-shi, Kyoto (JP)

(72) Inventor: Yoshiki Kawazu, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 15/111,238

(22) PCT Filed: Jan. 23, 2015

(86) PCT No.: PCT/JP2015/051904
§ 371 (c)(1),
(2) Date: Jul. 13, 2016

(87) PCT Pub. No.: WO2015/111721
PCT Pub. Date: Jul. 30, 2015

(65) Prior Publication Data
US 2016/0343628 A1 Nov. 24, 2016

(30) Foreign Application Priority Data

Jan. 24, 2014 (JP) ................................. 2014-011295

(51) Int. Cl.
*H05K 5/00* (2006.01)
*H01L 23/04* (2006.01)
(Continued)

(52) U.S. Cl.
CPC .......... *H01L 23/041* (2013.01); *H01L 23/057* (2013.01); *H01L 23/142* (2013.01);
(Continued)

(58) Field of Classification Search
CPC ... H01L 23/047; H01L 23/057; H05K 5/0091; H05K 5/0069
See application file for complete search history.

(56) References Cited

U.S. PATENT DOCUMENTS

| | | | | |
|---|---|---|---|---|
| 5,117,068 A | * | 5/1992 | Seieroe | ................... H01L 23/66 |
| | | | | 174/536 |
| 5,247,134 A | * | 9/1993 | Beltz | ..................... H01L 23/057 |
| | | | | 174/527 |

(Continued)

FOREIGN PATENT DOCUMENTS

| | | |
|---|---|---|
| JP | 2007-123950 A | 5/2007 |
| JP | 2009-099934 A | 5/2009 |
| JP | 2012-028521 A | 2/2012 |

OTHER PUBLICATIONS

International Search Report, PCT/JP2015/051904, dated Apr. 21, 2015, 2 pgs.

*Primary Examiner* — Hung V Ngo
(74) *Attorney, Agent, or Firm* — Vople and Koenig, P.C.

(57) ABSTRACT

An element-accommodating package which can improve frequency characteristics of an element-accommodating package having a coaxial connector, and a mounting structure are provided. An element-accommodating package includes a metallic substrate, a frame, a first coaxial connector, a second coaxial connector, and a circuit board. A groove is provided between one side of the frame and a side surface of the circuit board and between a first signal line and a second signal line.

6 Claims, 12 Drawing Sheets

(51) Int. Cl.
   *H01L 23/057*   (2006.01)
   *H01L 23/14*    (2006.01)
   *H01L 23/552*   (2006.01)
   *H01R 24/38*    (2011.01)
   *H01R 103/00*   (2006.01)

(52) U.S. Cl.
   CPC ........... *H01L 23/552* (2013.01); *H01R 24/38* (2013.01); *H05K 5/0069* (2013.01); *H05K 5/0091* (2013.01); *H01L 2924/0002* (2013.01); *H01R 2103/00* (2013.01)

(56) References Cited

U.S. PATENT DOCUMENTS

| | | | | |
|---|---|---|---|---|
| 5,268,533 A * | 12/1993 | Kovacs | H01L 23/04 | 174/524 |
| 5,374,786 A * | 12/1994 | Weger | H01L 23/047 | 174/152 GM |
| 5,435,058 A * | 7/1995 | Breit | H01L 21/50 | 174/564 |
| 5,539,151 A * | 7/1996 | Hamzehdoost | H01L 23/10 | 174/534 |
| 5,770,816 A * | 6/1998 | McNulty | H01L 23/10 | 174/554 |
| 5,792,984 A * | 8/1998 | Bloom | H01L 23/10 | 174/536 |
| 6,204,448 B1 * | 3/2001 | Garland | H01L 23/66 | 174/541 |
| 6,518,501 B1 * | 2/2003 | Kawahara | H01L 23/055 | 174/536 |
| 7,842,891 B2 * | 11/2010 | Kasai | H01L 23/045 | 174/564 |
| 2015/0181728 A1 * | 6/2015 | Tanaka | H05K 5/0095 | 361/820 |
| 2016/0104650 A1 * | 4/2016 | Tsujino | H01L 23/057 | 257/693 |

\* cited by examiner ical field

ELEMENT-ACCOMMODATING PACKAGE AND MOUNTING STRUCTURE

TECHNICAL FIELD

The present invention relates to an element-accommodating package capable of mounting and accommodating an element, and a mounting structure on which an element is mounted.

BACKGROUND ART

In recent years, with the progress of size reduction in devices, element-accommodating packages of small size have been developed on which an element such as a semiconductor device, a light-emitting diode, a piezoelectric element, a quartz resonator, a laser diode, or a photo diode can be mounted (for example, see Japanese Unexamined Patent Publication JP-A 2007-123950). Here, in an element-accommodating package in JP-A 2007-123950, there is proposed a structure including a substrate; a frame disposed on the substrate; and a coaxial connector disposed in a part of the frame.

In association with size reduction and capacity increase in the element-accommodating package, in particular, in an element-accommodating package for high frequency in which a signal at a frequency as high as 100 GHz is used, improvement is desired in the frequency characteristics at the time when a signal is inputted or outputted through a coaxial connector.

An object of the invention is to provide an element-accommodating package and a mounting structure in which the frequency characteristics in the element-accommodating package provided with a coaxial connector can be improved.

SUMMARY OF INVENTION

An element-accommodating package according to an embodiment of the invention comprises: a metallic substrate including an upper face having a mounting region on which an element is to be mounted; a frame disposed on the metallic substrate, the frame including four sides which surround the mounting region in a plan view of the element-accommodating package, a first through hole provided in one side among the four sides, and a second through hole provided adjacent to the first through hole in the one side; a first coaxial connector disposed in the first through hole and including a first center core; a second coaxial connector disposed in the second through hole and including a second center core; and a circuit board disposed in a region surrounded by the frame in a state where a part thereof is in contact with the one side of the frame in the plan view. Further, on an upper face of the circuit board is disposed: a first signal line connected to the first center core of the first coaxial connector; a second signal line connected to the second center core of the second coaxial connector; and a first ground conductor layer situated between the first signal line and the second signal line apart from each other. A second ground conductor layer is disposed on a lower face of the circuit board overlap with the first signal line and the second signal line in a transparent plan view of the element-accommodating package. Further, a groove is provided between the one side of the frame and a side surface of the circuit board and between the first signal line and the second signal line.

The mounting structure according to an embodiment of the invention comprises: the above-mentioned element-accommodating package; and an element mounted on the mounting region of the element-accommodating package.

DESCRIPTION OF EMBODIMENTS

Figure 1:
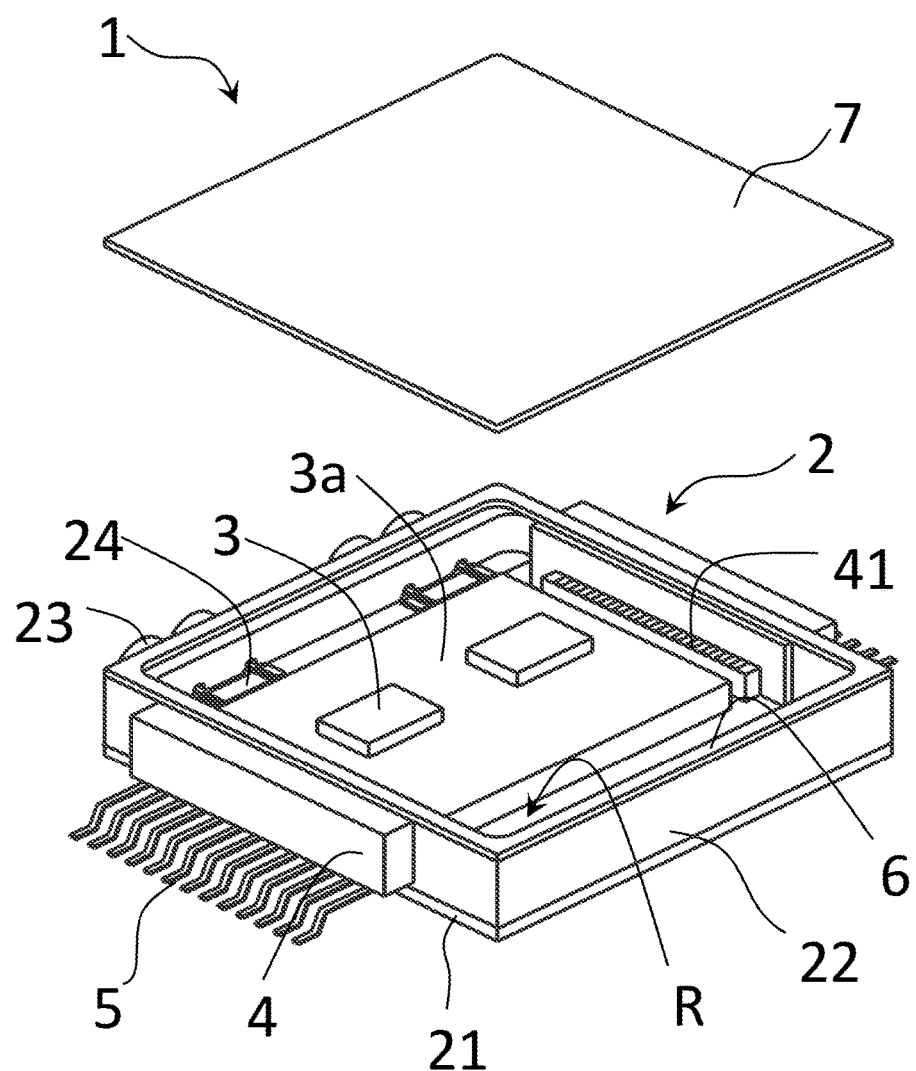
FIG. 1 is a schematic perspective view of a mounting structure according to an embodiment of the invention viewed from one direction, where a lid has been removed.

An element-accommodating package and a mounting structure according to an embodiment of the invention are described below with reference to the drawings.

<Configuration of Mounting Structure>

A mounting structure 1 comprises: an element-accommodating package 2; and an element 3 disposed in a mounting region R of the element-accommodating package 2. For example, the element-accommodating package 2 is used for mounting and accommodating the element 3 composed of: an active element such as a semiconductor device, a transistor, a laser diode, a photo diode, or a thyristor; or a passive element such as a resistor, a capacitor, a solar battery, a piezoelectric element, a quartz resonator, or a ceramic oscillator.

The element 3 is mounted on the base 3a. The base 3a is disposed in the mounting region R in the inside of the element-accommodating package 2. The base 3a is used for mounting the element 3 and can adjust the height position of the element 3. The base 3a is made of an insulating material, and on an upper face of the base 3a is disposed electric wirings electrically connected to the element 3. Here, in the present embodiment, two input/output terminals 4 are disposed, and two elements 3 corresponding to these terminals are mounted on the base 3a.

The element-accommodating package 2 is suitable for mounting and operation of the element 3 achieving high voltage tolerance, high current, high power, or high speed/ high frequency. Then, as an example of the element 3, a semiconductor device is mounted. Further, the element-accommodating package 2 comprises: a metallic substrate 21 including an upper face having the mounting region R on which the element 3 is to be mounted; a frame 22 disposed on the metallic substrate 21, the frame including four sides which surround the mounting region R in a plan view, a first through hole Ha provided in one side among the four sides, and a second through hole Hb provided adjacent to the first through hole Ha in the one side; a first coaxial connector 23a disposed in the first through hole Ha and including a first center core 231a; a second coaxial connector 23b disposed in the second through hole Hb and including a second center core 231b; and a circuit board 24 disposed in the mounting region R in a state where a part thereof is in contact with one side of the frame 22 in a plan view.

The metallic substrate 21 is a metal plate having a rectangular shape and is made, for example, of a metallic material such as copper, iron, tungsten, molybdenum, nickel, or cobalt, or an alloy containing these metallic materials. Here, for example, the thermal conductivity of the metallic substrate 21 is set to be 15 W/(m·K) or greater and 450 W/(m·K) or smaller. For example, the thermal expansion coefficient of the metallic substrate 21 is set to be $3 \times 10^{-6}$/K or greater and $28 \times 10^{-6}$/K or smaller.

The metallic substrate 21 is constructed into a predetermined shape by applying a metalworking method such as a rolling process or a punching process onto an ingot obtained by casting and solidifying a molten metallic material in a molding flask. Here, in the metallic substrate 21, for example, the length of each side in a plan view is set to be 5 mm or greater and 50 mm or smaller. Further, for example, the thickness of the metallic substrate 21 in the up and down directions is set to be 0.3 mm or greater and 5 mm or smaller.

Further, on the surface of the metallic substrate 21, for the purpose of preventing oxidation corrosion, a metal layer such as nickel or gold is formed by electroplating or electroless plating. Here, for example, the thickness of the metal layer is set to be 0.5 μm or greater and 9 μm or smaller.

The frame 22 is disposed on the metallic substrate 21. The frame 22 has four sides which surround the mounting region R in a plan view. In the frame 22, the coaxial connectors 23 are disposed in one side among the four sides. Further, in the frame 22, the input/output terminals 4 are disposed in both sides adjacent to the one side where the coaxial connectors 23 are disposed. The frame 22 is joined onto the metallic substrate 21 by using a brazing material such as a silver copper brazing material.

For example, the frame 22 is made of a metallic material such as copper, iron, tungsten, molybdenum, nickel, or cobalt, or an alloy containing these metallic materials. The frame 22 has a function of efficiently radiating, to the outside, heat generated by the elements 3 and a function of absorbing or dispersing a thermal stress. Here, for example, the thermal conductivity of the frame 22 is set to be 15 W/(m·K) or greater and 450 W/(m·K) or smaller. For example, the thermal expansion coefficient of the frame 22 is set to be $3 \times 10^{-6}$/K or greater and $28 \times 10^{-6}$/K or smaller. Further, for example, the thickness of the frame 22 in the up and down directions is set to be 5 mm or greater and 20 mm or smaller. Further, for example, the thickness of the side of the frame 22 in a plan view is set to be 0.5 mm or greater and 3 mm or smaller.

Further, in the frame 22, a stepped portion 22a onto which the circuit board 24 is placed is provided in the one side to which the coaxial connectors 23 are connected. The stepped portion 22a is a part of the frame 22, and is integrated therewith. In the stepped portion 22a, the length protruding out from the one side of the frame 22 toward a region surrounded by the frame 22 is set to be, for example, 1 mm or greater and 10 mm or smaller. Further, the length in the up and down directions is set to be, for example, 0.5 mm or greater and 5 mm or smaller, and the length in a direction along the one side of the frame 22 is set to be, for example, 5 mm or greater and 50 mm or smaller.

Figure 4:
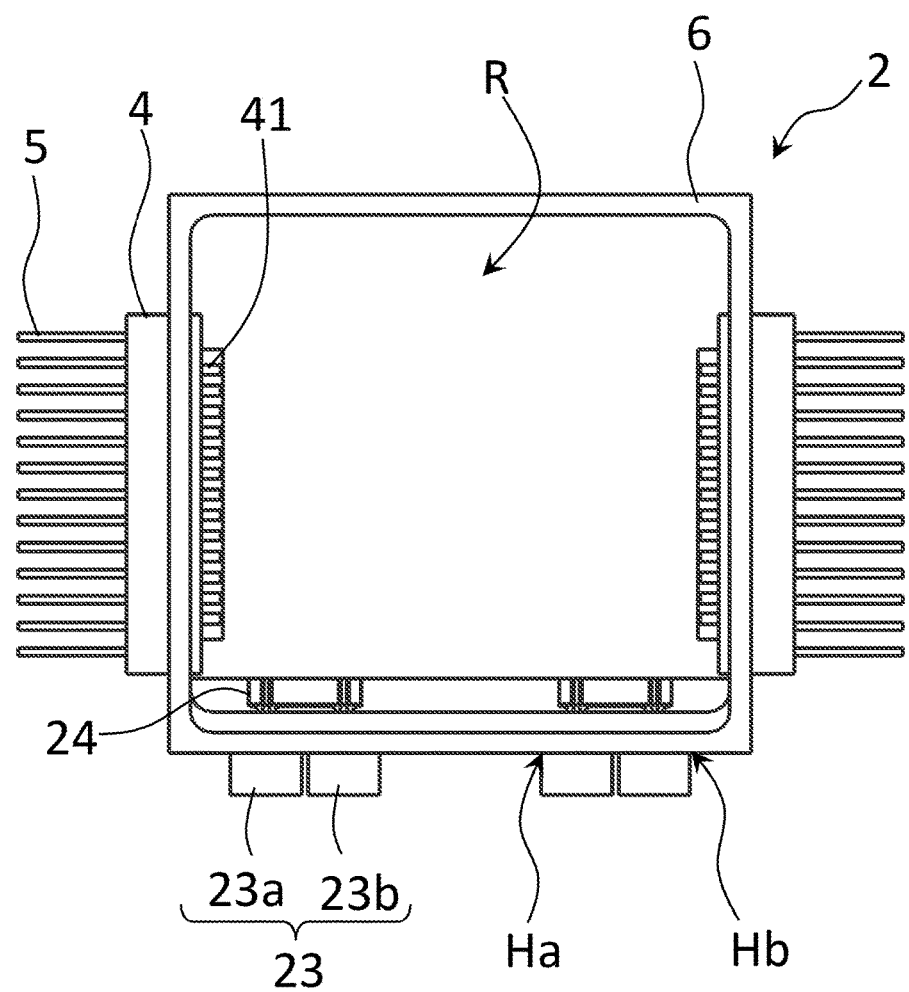
FIG. 4 is a plan view of the element-accommodating package according to the embodiment of the invention.

The input/output terminal 4 is provided in an edge of the metallic substrate 21, and establishes electrical connection between the inside of the frame 22 and the outside of the frame 22. The input/output terminal 4 has a rectangular parallelepiped shape, and is cut out from the upper face to the side surface located in the inside of the frame 22. In the input/output terminal 4, as shown in FIG. 4, a part of the lower face protrudes laterally. Then, lead terminals 5 are connected to a part of the lower face of the input/output terminal 4 protruding laterally.

The input/output terminal 4 is made of an insulating material, for example, a ceramic material such as an aluminum-oxide based sintered compact, a mullite-based sintered compact, a silicon-carbide based sintered compact, an aluminum-nitride based sintered compact, a silicon-nitride based sintered compact, or a glass ceramics. Here, for example, the thermal expansion coefficient of the input/output terminal 4 is set to be $3 \times 10^{-6}$/K or greater and $8 \times 10^{-6}$/K or smaller.

The input/output terminal 4 may be formed by stacking a plurality of layers. Here, a manufacturing method for the input/output terminal 4 is described below. For example, in a case that the input/output terminal 4 is made of an aluminum-oxide based sintered compact, an organic binder, a plasticizer, a solvent, or the like is added and mixed into raw material powder of aluminum oxide, silicon oxide, magnesium oxide, calcium oxide, or the like so as to obtain a mixture and obtain a green sheet formed in a sheet shape.

Further, the input/output terminal 4 is provided with wiring conductors to which the lead terminals 5 are connected. When the input/output terminal 4 is formed, high melting-point metal powder of tungsten, molybdenum, or the like serving as a raw material for the wiring conductors is prepared. Then, an organic binder, a plasticizer, a solvent, or the like is added and mixed into this powder so as to obtain a metal paste. Then, the unfired green sheet is die-cut into a predetermined shape and then the metal paste is printed onto a predetermined portion.

Then, plural layers of green sheets on which the metal paste has been printed are stacked together and then co-fired at a predetermined temperature so as to obtain the input/output terminal 4 formed in an integrated manner. Further, the lead terminals 5 are connected to the wiring conductors of the lower face of the input/output terminal 4 via a brazing material. Here, the input/output terminal 4 is provided with wiring conductors 41 to which the lead terminals 5 and the bonding wires are connected.

The lead terminal 5 is a member for electrically connecting the element 3 to an external electronic device or the like. The lead terminal 5 is connected, via a brazing material, to the wiring conductor formed on the lower face of the input/output terminal 4. By virtue of this, the lead terminal 5 is electrically connected to the wiring conductor. Further, a plurality of wiring conductors are formed on the lower face of the input/output terminal 4, and the plurality of wiring conductors are provided at intervals. Thus, adjacent wiring conductors are electrically insulated from each other. Then, when each lead terminal 5 is provided in each wiring conductor, adjacent lead terminals 5 are electrically insulated from each other. Here, the lead terminal 5 is made of a conductive material, and is made, for example, of a metallic material such as copper, iron, tungsten, molybdenum, nickel, or cobalt, or an alloy containing these metallic materials.

Figure 5:
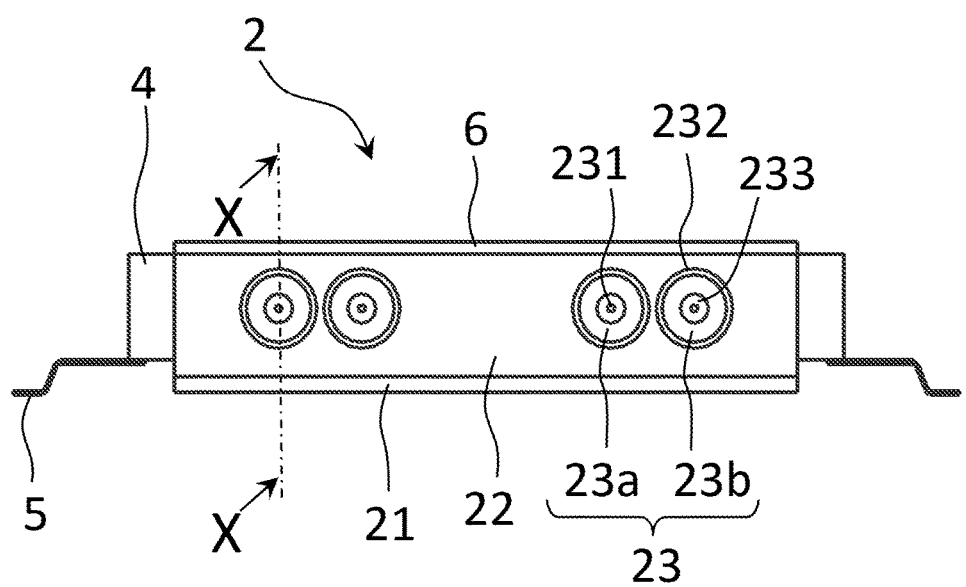
FIG. 5 is a side view of the element-accommodating package according to the embodiment of the invention.

As shown in FIG. 5, the lead terminal 5 extends along a planar direction, and is bent between one end of the lead terminal 5 and the other end of the lead terminal 5. As shown in FIG. 5, the lead terminals 5 are bent and adjusted so that a height position of the lower face of the lead terminals 5 may agree with a height position of the lower face of the metallic substrate 21. By virtue of this, the metallic substrate 21 and the lead terminals 5 can be mounted in a state of being flat relative to an external substrate. Then, the element-accommodating package 2 can be connected to the external substrate with an increase in an area of fixing to the external substrate in a state of not being inclined relative to the external substrate. As a result, the element-accommodating package 2 can be stably and connected firmly to the external substrate.

The wiring conductors 41 are formed also in a region which is located on an upper face of the input/output terminal 4 and surrounded by the frame 22. Then, the wiring conductors 41 are electrically connected to the electrodes of the element 3, for example, through bonding wires. Further, the wiring conductors 41 extend from the upper face of the input/output terminal 4 to the inside of the input/output terminal 4. Further, the wiring conductors 41 extend through a via hole in the input/output terminal 4 even to the lower face of the input/output terminal 4. Then, the element 3 is electrically connected through the wiring conductors 41 to the lead terminals 5.

A first metal layer is formed in a part of the upper face of the input/output terminal 4. As for the first metal layer, since a body portion of the input/output terminal 4 is made of a ceramic material, at the time when the body portion of ceramic material is to be connected to the frame-shaped portion of metallic material of the frame 22 and a seal ring 6 via a brazing material, the first metal layer can serve as an underlayer for the brazing material. Further, the first metal layer is connected to a conductor having a potential serving as a reference potential, for example, to a ground conductor. Then, the first metal layer serves as a shield electrode for the wiring conductors 41 so as to reduce an influence of electromagnetic waves from the outside. Thus, high frequency currents flowing through the wiring conductors 41 can easily be maintained in a desired state.

Further, a second metal layer different from the first metal layer is formed in a portion located in the lower face of the input/output terminal 4 and connected to the metallic substrate 21. The second metal layer permits connection between the body portion made of a ceramic material of the input/output terminal 4 and the metallic substrate 21 made of a metallic material, which is achieved via a brazing material. The second metal layer is set at a predetermined potential so as to serve as a reference potential.

The second metal layer is disposed on the lower face of the input/output terminal 4 apart from the wiring conductors 41. Then, the second metal layer is electrically insulated from the wiring conductors 41. The second metal layer serves as a shield electrode for the wiring conductors 41 so as to protect the wiring conductors 41 from external electromagnetic waves. Further, occurrence of an electromagnetic noise in the wiring conductors 41 can be suppressed.

Further, a third metal layer different from the first metal layer and the second metal layer is formed in a portion which is on a side surface parallel to the short sides of the input/output terminals 4 in a plan view and which is connected to the frame 22. The third metal layer permits connection between the body portion made of a ceramic material of the input/output terminal 4 and the frame 22 made of a metallic material, via a brazing material. The third metal layer is set at a predetermined potential so as to serve as a reference potential.

In the frame 22, the first through hole Ha and the second through hole Hb are provided in the one side located between the pair of input/output terminals 4. The second through hole Hb is provided in the one side of the frame 22 apart from and adjacent to the first through hole Ha. A first coaxial connector 23a including a first center core 231a is provided in the first through hole Ha. A second coaxial connector 23b including a second center core 231b is provided in the second through hole Hb. Each coaxial connector 23 is used for electrically connecting each internal element 3 to an external coaxial cable.

A coaxial connector 23 composed of a connector for communication or a connector for coaxial is attached to each of the first through hole Ha and the second through hole Hb from the outside toward the frame 22. Here, the size of the first through hole Ha or the second through hole Hb is set to be a size that permits attaching of the coaxial connector 23 to be attached from the outside.

Figure 6:
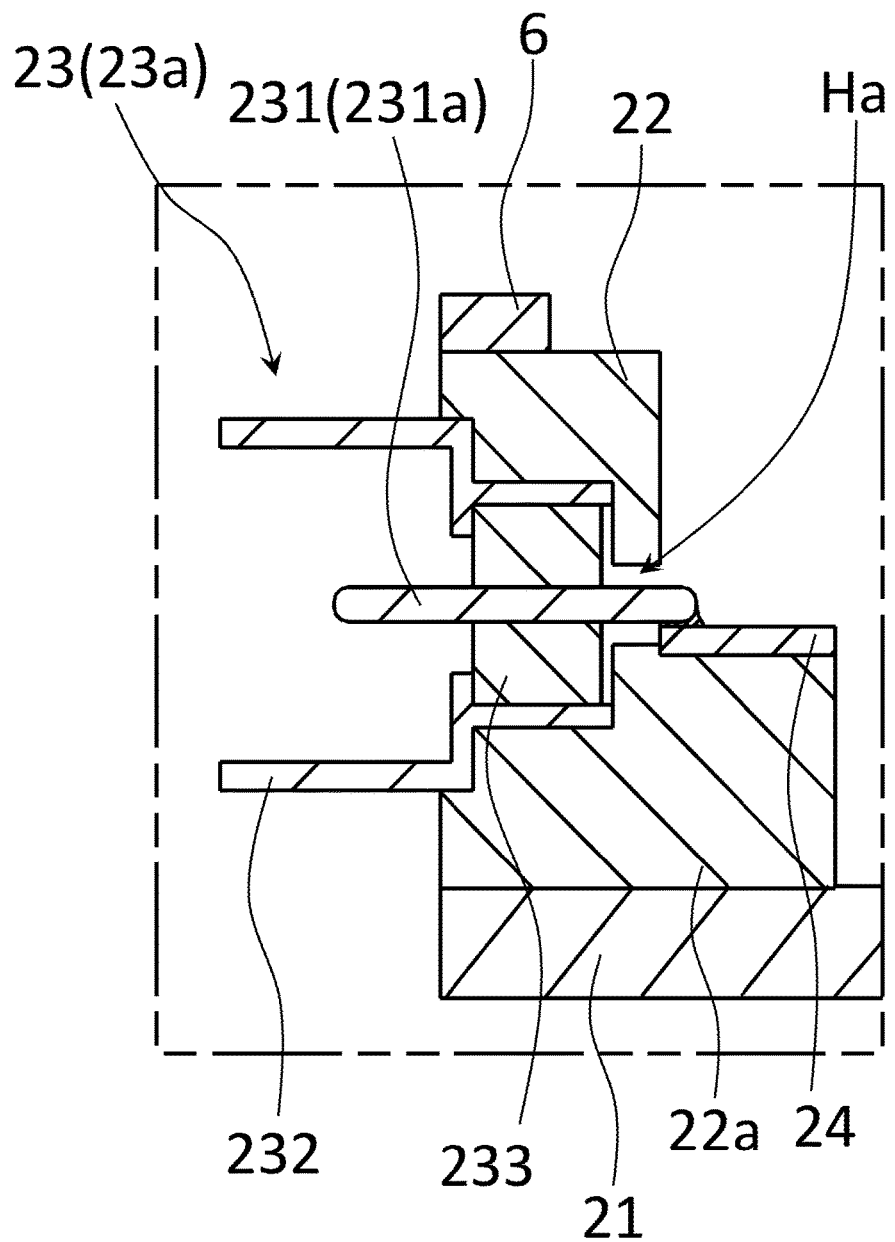
FIG. 6 is a sectional view taken along the line X-X in FIG. 5.
Figure 7:
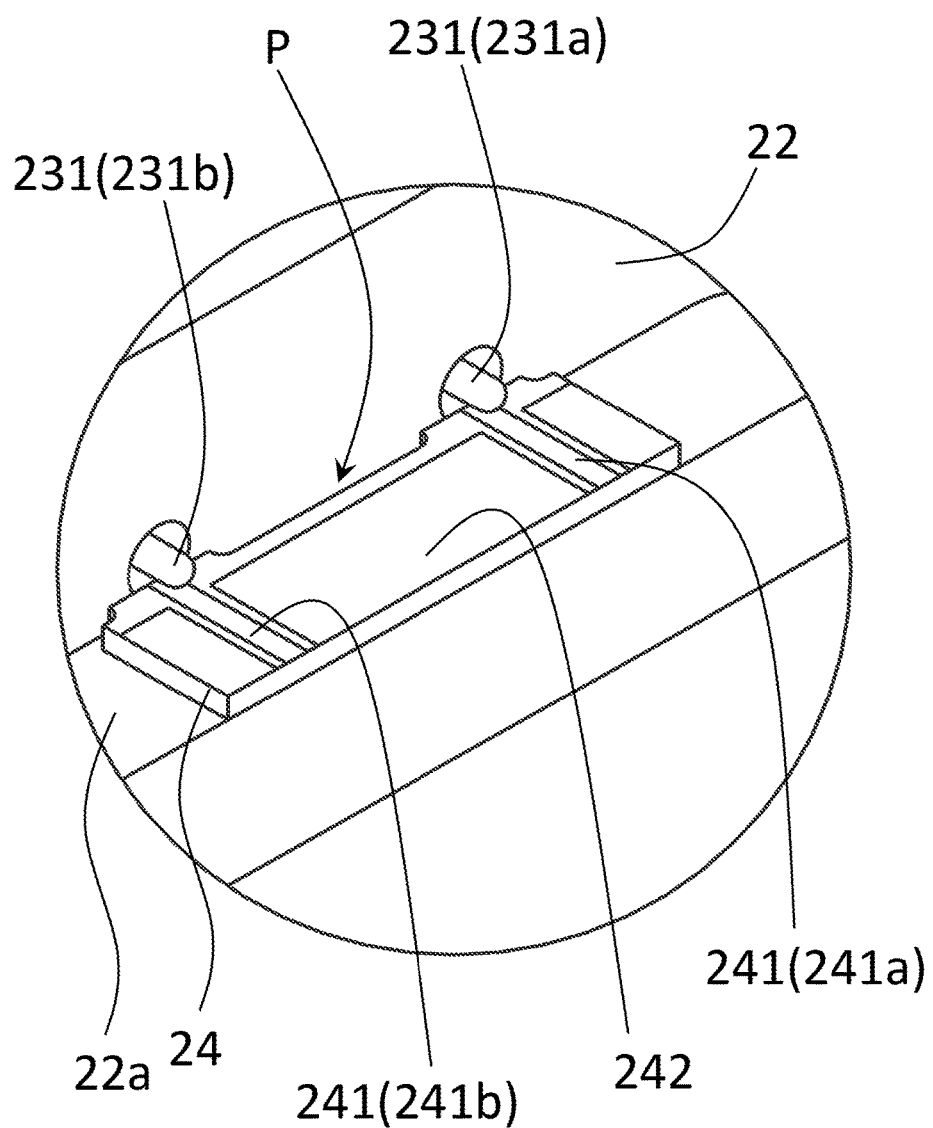
FIG. 7 is an external appearance perspective view showing in an enlarged manner a circuit board and its periphery in the element-accommodating package according to the embodiment of the invention.

As shown in FIG. 6, the coaxial connector 23 comprises: a center core 231 for electrically connecting together the inside and the outside of the frame 22; a metallic member 232 which surrounds the periphery of the center core 231 apart from the center core 231; and a dielectric material 233 located between the center core 231 and the metallic member 232. The coaxial connector 23 is used for transferring an external electric signal to the circuit board 24 in the inside of the package or, alternatively, an electric signal of the circuit board 24 in the inside of the package to the outside.

The center core 231 has a function of transferring a predetermined electric signal. For example, the center core 231 is made of a metallic material such as copper, silver, gold, iron, aluminum, nickel, cobalt, or chromium. The metallic member 232 has a function of realizing a common potential such as a reference potential. Further, for example, the metallic member 232 is made of a metallic material such as copper, silver, gold, iron, aluminum, nickel, cobalt, or chromium. Then, the frame 22 is made of a metallic material, and the metallic member 232 and the frame 22 are electrically connected to each other.

The dielectric material 233 is made of an insulating material and is made, for example, of: an inorganic material such as aluminum oxide, aluminum nitride, or a silicon nitride; an organic material such as an epoxy resin, polyimide resin, or an ethylene resin; a glass material such as borosilicate glass; or a ceramic material such as an aluminum-oxide based sintered compact, a mullite-based sintered compact, a silicon-carbide based sintered compact, an aluminum-nitride based sintered compact, a silicon-nitride based sintered compact, or a glass ceramics. Alternatively, the dielectric material 233 is made of a composite material obtained by mixing a plurality of materials selected from these materials.

The circuit board 24 is provided in a region surrounded by the frame 22 in a state where a part thereof is in contact with the one side of the frame 22 in a plan view. In the circuit board 24, the signal line 241 of the center core 231 and the circuit board 24 of the coaxial connector 23 are electrically connected to each other via a brazing material.

On the upper face of the circuit board 24 are disposed: a first signal line 241a connected to the first center core 231a of the first coaxial connector 23a; a second signal line 241b connected to the second center core 231b of the second coaxial connector 23b; and a first ground conductor layer 242 situated between the first signal line 241a and the second signal line 241b apart from each other. Further, a second ground conductor 243 is disposed on the lower face of the circuit board 24 so as to overlap with the first signal line 241a and the second signal line 241b in a transparent plan view. Here, the second ground conductor 243 may be provided over the entirety of the lower face of the circuit board 24, as a ground electrode for stabilizing a joining property with the metallic substrate 21 or the transmission characteristics of a high frequency signal transmitted through the first signal line 241a or the second signal line 241b.

Figure 8:
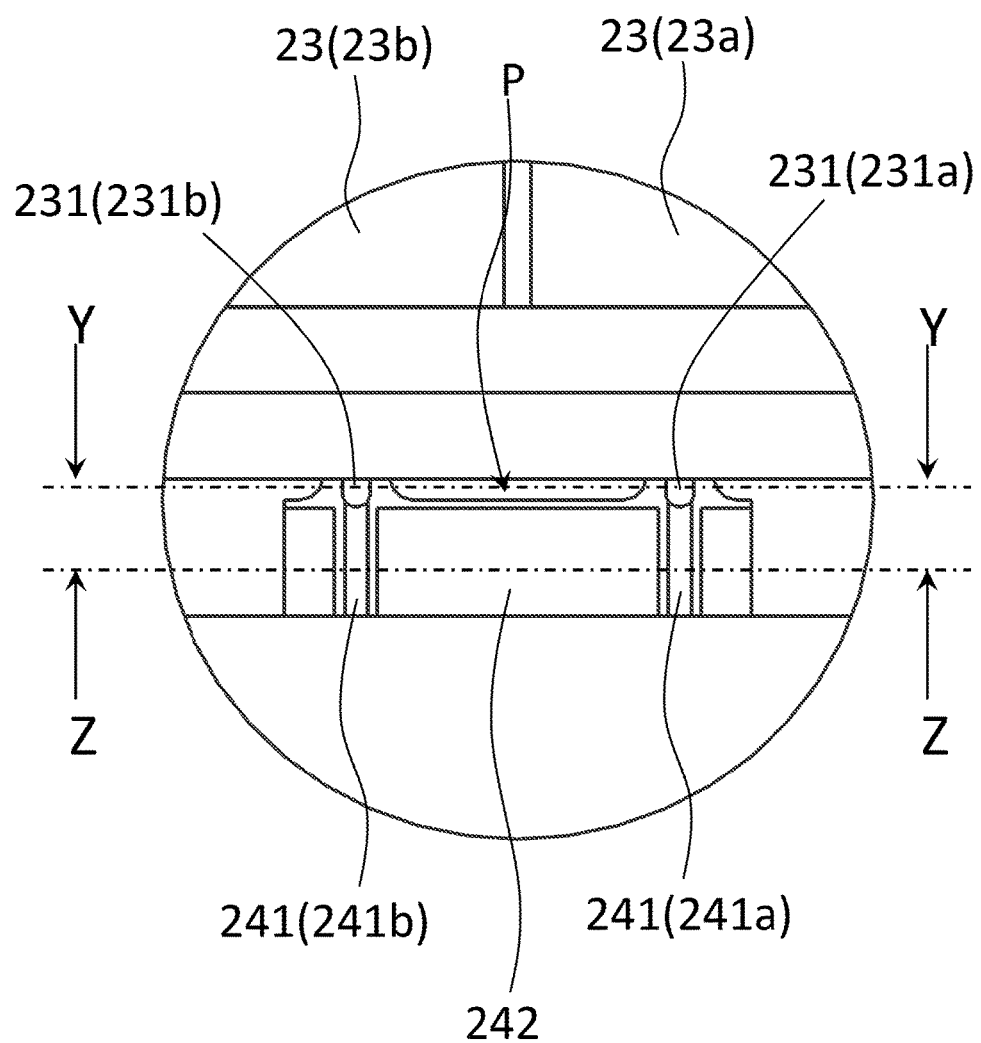
FIG. 8 is a plan view showing in an enlarged manner the circuit board and its periphery in the element-accommodating package according to the embodiment of the invention.

Further, in the circuit board 24, a groove P is provided between the one side of the frame 22 and the side surface opposed thereto and between the first signal line 241a and the second signal line 241b. The groove P is provided by forming a recess in the side surface of the circuit board 24. Then, as shown in FIG. 8, a part of the upper face of the stepped portion 22a is exposed within the groove P in a plan view. Here, in the circuit board 24, the length of one side in a plan view is set to be 2 mm or greater and 20 mm or smaller, and the thickness in the up and down directions is set to be 0.2 mm or greater and 2 mm or smaller. In the recess of the circuit board 24, the depth is set to be, for example, 0.1 mm or greater and 1 mm or smaller, and the length along one side of the circuit board 24 is set to be, for example, 1 mm or greater and 10 mm or smaller.

Further, each of two corners of four corners of the circuit board 24 which are opposed to the one side (the inner face) of the frame 22 is provided with a cutout. Further, the cutout is provided in such a portion that the cutout and the groove P sandwich the first signal line 241a. Further, the cutout is provided in such a portion that the cutout and the groove P sandwich the second signal line 241b.

In the frame 22, the seal ring 6 is provided continuously along the side of the frame 22 via a brazing material. In a case where a lid 7 is provided so as to cover the inside of the frame 22, the seal ring 6 connects the lid 7 to the frame 22. Here, for example, the seal ring 6 is made of a metal such as copper, tungsten, iron, nickel, or cobalt or an alloy containing plural kinds of these metals, which have an excellent seam welding property to the lid 7. Here, for example, the thermal expansion coefficient of the seal ring 6 is set to be $4\times10^{-6}$/K or greater and $16\times10^{-6}$/K or smaller.

Further, the lid 7 is disposed on the seal ring 6 so as to cover the elements 3 in the frame 22. The lid 7 is used for hermetic sealing of the region surrounded by the frame 22. For example, the lid 7 is made of: a metal such as copper, tungsten, iron, nickel, or cobalt; an alloy containing plural kinds of these metals; or ceramics such as an aluminum-oxide based sintered compact, a mullite-based sintered compact, a silicon-carbide based sintered compact, an aluminum-nitride based sintered compact, a silicon-nitride based sintered compact, or a glass ceramics. Further, for example, the lid 7 is joined onto the seal ring 6 by seam welding or, alternatively, joined via a joining member such as solder and a brazing material.

The region surrounded by the frame 22 is in a vacuum state or, alternatively, filled with nitrogen gas or the like. Then, when the lid 7 is disposed on the seal ring 6, the region surrounded by the frame 22 can be brought into a hermetically sealed state. The lid 7 is placed on the seal ring 6 in a predetermined atmosphere and then undergoes seam welding so as to be attached onto the seal ring 6. Further, for example, the lid 7 may be attached via a joining material such as a brazing material, a glass joining material, and a resin joining material.

Figure 9:
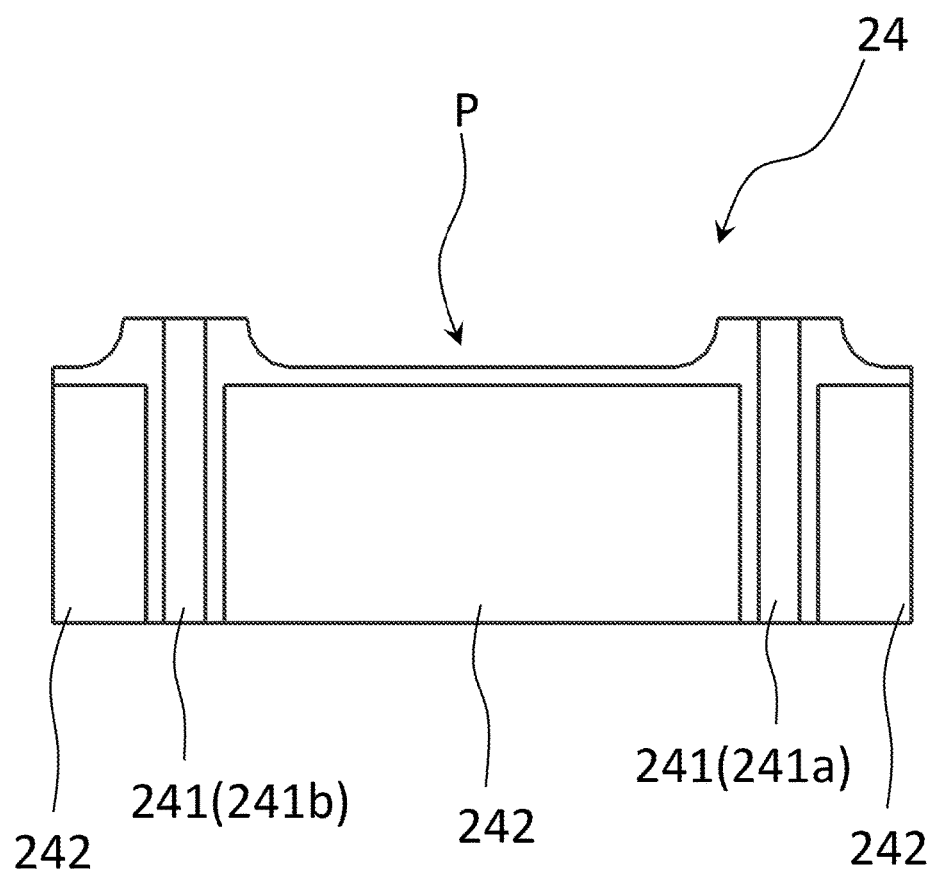
FIG. 9 is a plan view of the circuit board shown in FIG. 8.
Figure 10:
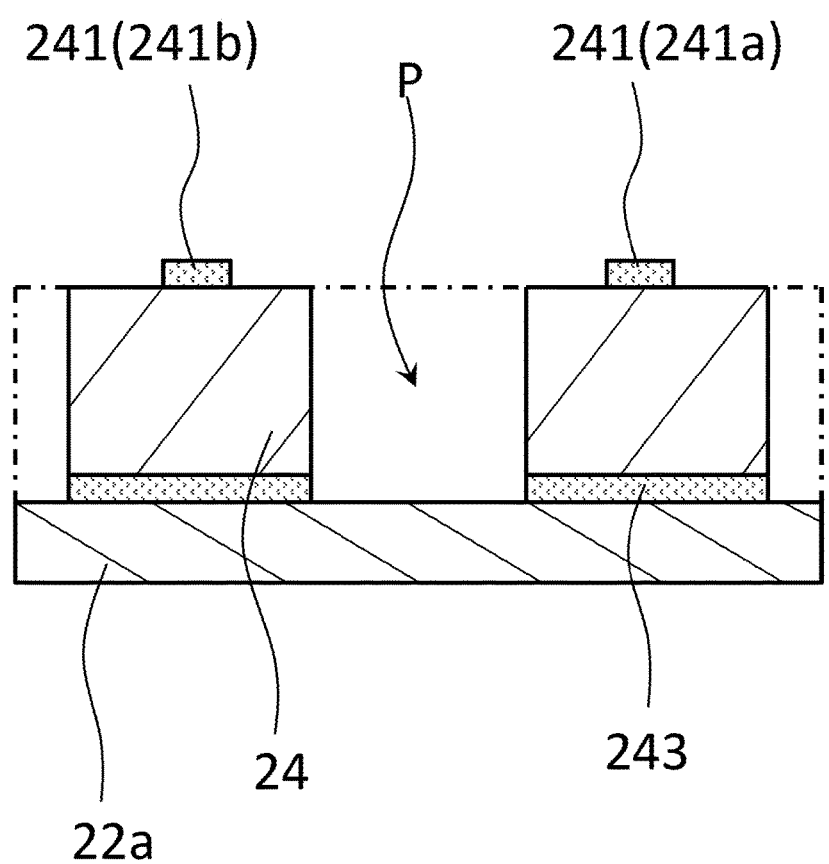
FIG. 10 is a sectional view taken along the line Y-Y in FIG. 8.
Figure 11:
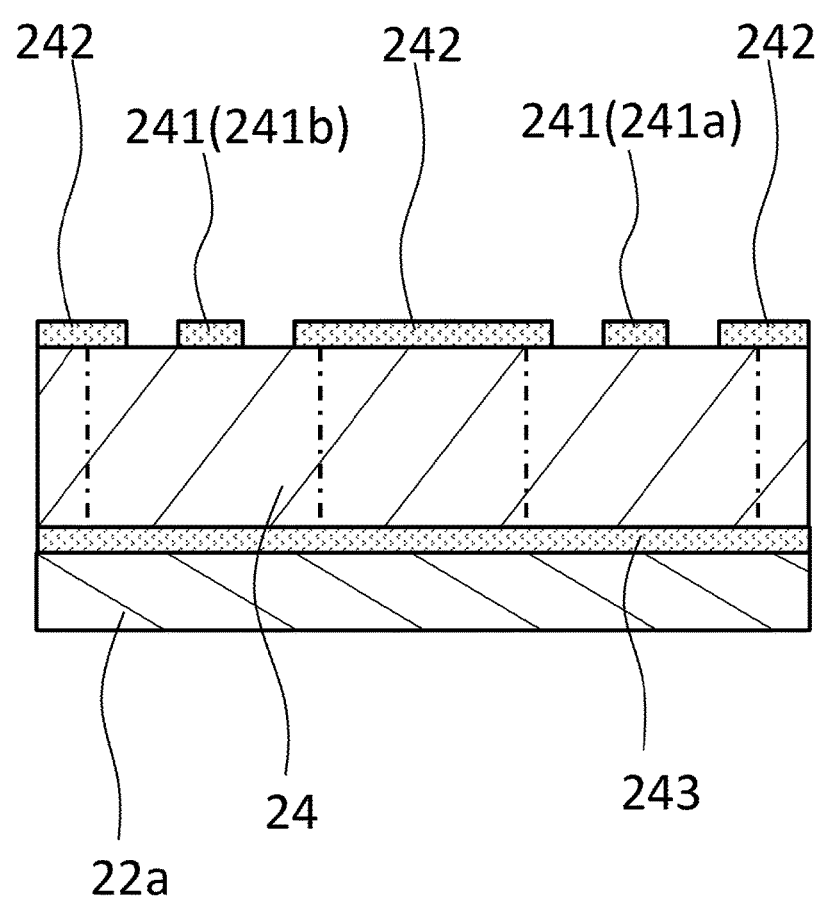
FIG. 11 is a sectional view taken along the line Z-Z in FIG. 8.

In the mounting structure 1 and the element-accommodating package 2 according to the present embodiment, in the signal path from the coaxial connector 23 to the signal line 241, as shown in FIG. 10, the groove P is provided in the side surface of the circuit board 24 opposed to the frame 22 from the inner peripheral surface of the frame 22 to the axial direction of the center core 231 connected to the signal line 241 of the circuit board 24. In addition, the cutouts are provided in the corners of the circuit board 24 sandwiching the groove P and, further, the ground conductor layer is not provided on the upper face of the circuit board 24 located between the groove P and each cutout. By virtue of this, the connection portion of the signal line 241 to which the coaxial connector 23 is connected can serve as a microstrip line. Further, in the signal line 241 located between the first ground conductor layers 242 on the circuit board 24 can serve as a coplanar line as shown in FIG. 11. As a result, the frequency characteristics of the signal path from the coaxial connector 23 to the signal line 241 can be improved. That is, in a case where the groove P and the cutouts are not provided, at the time when a high frequency signal is transmitted from the coaxial connector 23 to the signal line 241, an electric field distribution generated between the connection portion between the center core 231 and the signal line 241 and the circuit board 24 causes an increase in the electrostatic capacitance. Thus, as described above, when the groove P and the cutouts are provided so as to sandwich the connection portion between the center core 231 and the signal line 241 so that a microstrip line is formed, the electrostatic capacitance in the connection portion between the center core 231 and the signal line 241 can be reduced. As a result, the groove P and the cutouts can suppress a decrease in the characteristic impedance that occurs in the connection portion between the center core 231 and the signal line 241, so that the frequency characteristics can be improved. Further, as shown in FIG. 9, the first ground conductor layers 242 may be formed at fixed intervals from the groove P and the bottom portions of the cutouts provided in the corners of the circuit board 24 sandwiching the groove P toward the inner side of the package in a plan view. By virtue of this, the electrostatic capacitance and the characteristic impedance between the connection portion to the signal line 241 where the coaxial connector 23 is connected and the signal line 241 located between the first ground conductor layers 242 on the circuit board 24 can be changed stepwise. As a result, the insertion loss and the return loss generated between the connection portion to the signal line 241 where the coaxial connector 23 is connected and the signal line 241 located between the first ground conductor layers 242 on the circuit board 24 can be suppressed.

Further, in the groove P and the cutouts, it is preferable that the lengths of the center cores 231 in the axial direction, that is, the lower end of the groove P and the lower end of each cutout, are at the same height position. By virtue of this, the electric field distribution generated in the connection portion between the center core 231 and the signal line 241 can be made line-symmetric in a cross section perpendicular to the axis of the center core 231. As a result, at the time when a high frequency signal is transmitted from the coaxial connector 23 to the signal line 241, resonance which occurs in the high frequency signal can be suppressed.

Further, in a plan view, it is preferable that the intervals of the groove P and the cutouts with the axis of the center core 231 are the same as each other. By virtue of this, the electric field distribution generated in the connection portion between the center core 231 and the signal line 241 as described above can be made line-symmetric in a cross section perpendicular to the axis of the center core 231, and hence resonance of the high frequency signal which occurs from the coaxial connector 23 to the signal line 241 can be suppressed.

Further, it is preferable that the circuit board 24 is joined so as to abut against the inner peripheral surface of the frame 22 via the groove P and the cutouts. By virtue of this, the electric field distribution generated in the connection portion between the center core 231 and the signal line 241 as described above can be made line-symmetric in a cross section perpendicular to the axis of the center core 231, and hence resonance of the high frequency signal which occurs from the coaxial connector 23 to the signal line 241 can be suppressed.

Further, it is preferable that the first ground conductor layers 242 are provided at fixed intervals in parallel to the bottom face of the groove P and the cutouts in a plan view. This can suppress a decrease in the characteristic impedance that occurs in the connection portion between the center core 231 and the signal line 241 as described above. Further, the frequency characteristics can be improved and the electric field distribution generated in the center core 231 and the signal line 241 can be made line-symmetric in a cross section perpendicular to the axis of the center core 231 so that resonance of the high frequency signal which occurs from the coaxial connector 23 to the signal line 241 can be suppressed.

Further, in the groove P and the cutouts, in a plan view, it is preferable that the length of the center core 231 in the axial direction is shorter than the length of the center core 231 protruding inward of the package from the inner peripheral surface of the frame 22. As a result, a decrease in the characteristic impedance that occurs in the joining portion between the center core 231 and the signal line 241 as described above can be suppressed so that the frequency characteristics can be improved.

Further, it is preferable that the groove P and the cutouts are provided at fixed intervals in parallel to the inner peripheral surface of the frame 22 in a plan view. By virtue of this, the electric field distribution generated in the center core 231 and the signal line 241 can be made line-symmetric in a cross section perpendicular to the axis of the center core 231, and hence resonance of the high frequency signal which occurs from the coaxial connector 23 to the signal line 241 can be suppressed.

Further, in the coaxial connector 23, a plate-shaped electrically conductive member protruding inward of the package and having a thickness thinner than the diameter of the center core 231 may be connected to the lower end portion of the center core 231 in the inner side of the package and then connected to the signal line 241 via an electrically conductive connection member such as gold-tin solder. By virtue of this, the electrostatic capacitance in the electrically conductive member serving as the connection portion between the center core 231 and the signal line 241 can be reduced. This can suppress a decrease in the characteristic impedance which occurs in the connection portion between the center core 231 and the signal line 241, and hence the frequency characteristics can be improved. Further, in the groove P and the cutouts in a plan view, it is preferable that the length of the center core 231 in the axial direction is shorter than the length of the plate-shaped electrically conductive member protruding inward of the package from the inner peripheral surface of the frame 22. As a result, a decrease in the characteristic impedance that occurs in the joining portion between the electrically conductive member and the signal line 241 as described above can be suppressed so that the frequency characteristics can be improved.

Figure 12:
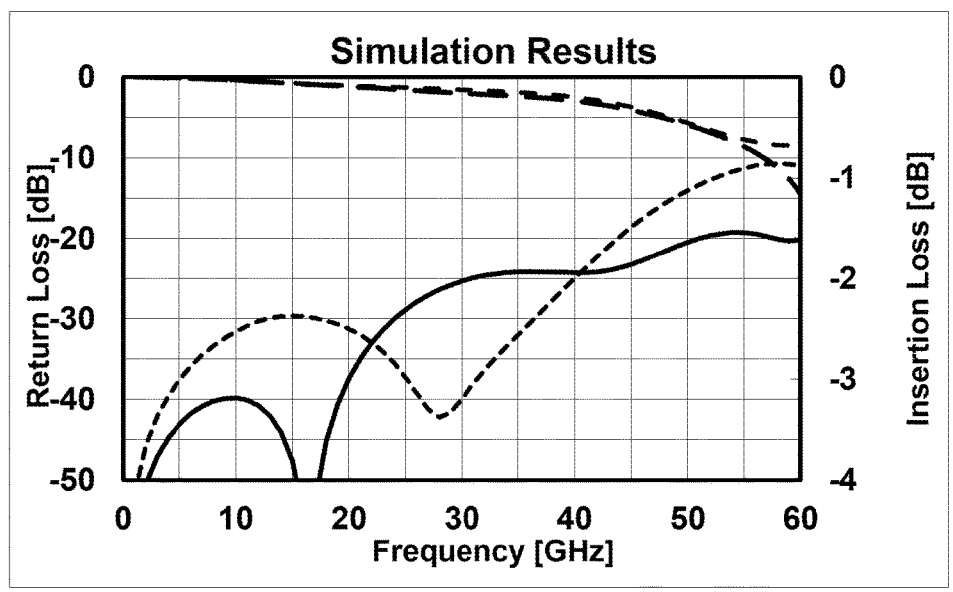
FIG. 12 is a graph showing simulation results of the frequency characteristics for a high frequency signal in a coaxial connector in the element-accommodating package and the mounting structure according to the present embodiment.

FIG. 12 is a graph showing simulation results of the frequency characteristics (S-parameters) (Return Loss "S11" and Insertion Loss "S21") for a high frequency signal in the coaxial connector 23 in the element-accommodating package and the mounting structure according to the present embodiment. Among the frequency characteristics of the present embodiment, the return loss is indicated by a solid line and, among the frequency characteristics of a comparative example, the return loss is indicated by a dotted line. Further, among the frequency characteristics of the present embodiment, the insertion loss is indicated by a long dashed line and, among the frequency characteristics of the comparative example, the insertion loss is indicated by a dashed line. Here, the present embodiment indicates a configuration that the groove P is provided in the circuit board 24, and the comparative example indicates a configuration that the groove P is not provided in the circuit board 24. As for the return loss, the return loss approaches 0 dB with increasing frequency from 0 GHz. Further, the insertion loss is 0 dB at a frequency of 0 GHz and, a deviation from 0 dB gradually increases with increasing frequency. Then, the frequency at which the insertion loss begins to suddenly deviate from 0 dB is a so-called resonance frequency. As for the insertion loss, no large difference is found between the frequency characteristics of the present embodiment and the frequency characteristics of the comparative example. As for the return loss, numerical values between −20 dB to 0 dB are obtained in a range from 45 GHz to 60 GHz in the comparative example whereas numerical values smaller than or equal to approximately −20 dB can be obtained in the range from 45 GHz to 60 GHz in the present embodiment. As such, according to the invention, it is possible to provide the element-accommodating package 2 and the mounting structure 1 in which the frequency characteristics can be improved.

The invention is not limited to the above-mentioned embodiment, and various changes, improvements, or the like are possible without departing from the scope of the invention.

<Manufacturing Method of Mounting Structure>

Figure 2:
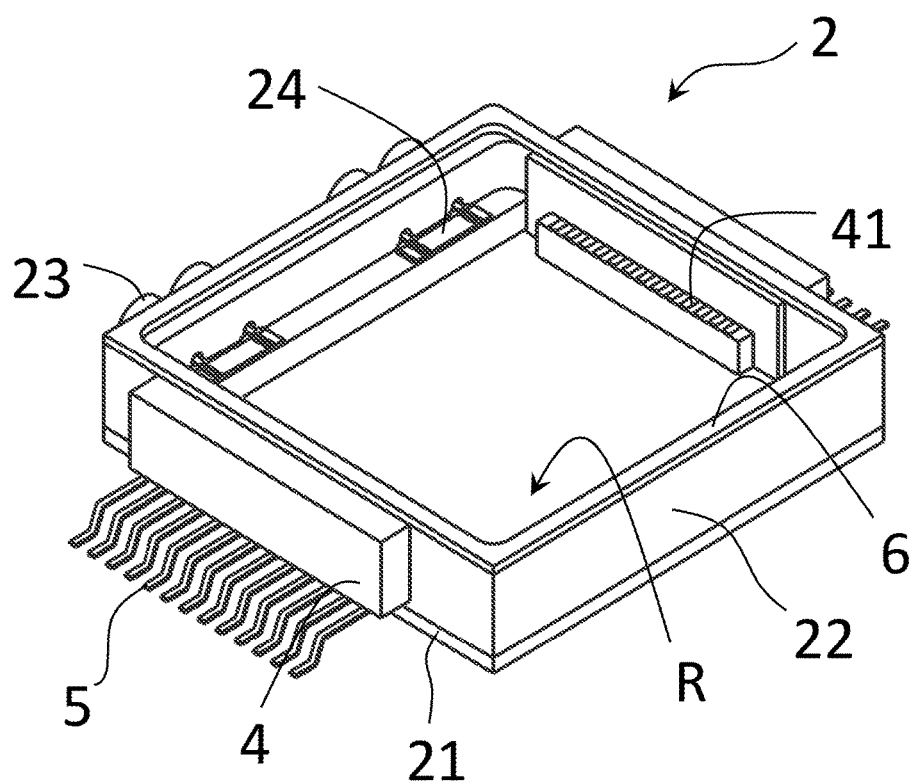
FIG. 2 is an external appearance perspective view of an element-accommodating package according to the embodiment of the invention viewed from a direction.
Figure 3:
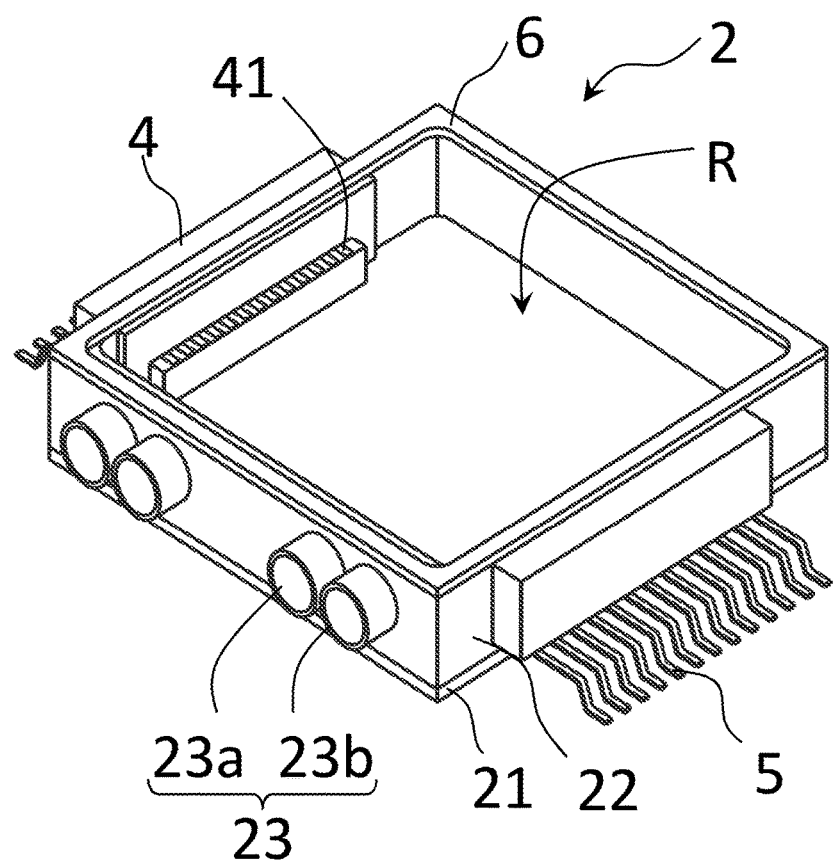
FIG. 3 is an external appearance perspective view of the element-accommodating package according to the embodiment of the invention viewed from another direction.

Here, a manufacturing method of the mounting structure 1 shown in FIG. 1 or 2 is described below. First, the element-accommodating package 2 and the elements 3 are prepared. The metallic substrate 21 and the frame 22 of the element-accommodating package 2 are manufactured in predetermined shapes by applying a metalworking method such as a rolling process or a punching process well known in the conventional art onto an ingot obtained by casting and solidifying a molten metallic material in a molding flask. Further, the input/output terminals 4 are manufactured by the manufacturing method described above.

Then, the metallic substrate 21, the frame 22, and the input/output terminals 4 are connected together via a brazing material. Further, the coaxial connectors 23 are fitted in and connected to the first through hole Ha and the second through hole Hb of the frame 22 via gold-tin solder. Further, the circuit board 24 is mounted on the upper face of the stepped portion 22a provided in the lower end portion in the inner side of the side wall of the frame 22 in which the first through hole Ha and the second through hole Hb have been provided. In addition, each center core 231 is electrically connected to each signal line 241 via an electrically conductive joining material such as gold-tin solder. As such, the element-accommodating package 2 can be manufactured. Further, each base 3a is provided in the mounting region R of the element-accommodating package 2 via a joining material such as gold-tin solder and an insulating resin joining material. Further, each element 3 is mounted on the base 3a, and then the electrodes of the element 3 are electrically connected through bonding wires to the wiring conductors 41 of the input/output terminal 4 and the signal lines 241 of the circuit board 24. Further, the seal ring 6 and the lid 7 are attached to the element-accommodating package 2 so that the mounting structure 1 can be manufactured.

The invention claimed is:

1. A package for accommodating an element, the package comprising:
   a substrate comprising a substrate upper face;
   a mounting region disposed on the substrate upper face;
   a frame disposed on the substrate upper face and comprising:
      an inner wall surrounding the mounting region; and
      and outer wall;
   a circuit board comprising:
      a circuit board upper face comprising:
         a first signal line and a second signal line; and
         a first conductor layer extending a distance between the first signal line and the second signal line;
      a circuit board lower face comprising a second conductor layer overlapping with the first signal line and the second signal line in a transparent plan view; and
      a side, in contact with the inner wall, and having a recess facing the inner wall and disposed between the first signal line and the second signal line;
   a first connector on the inner wall, connected to the first signal line; and
   a second connector on the inner wall, connected to the second signal line.

2. The package according to claim 1, wherein
   the recess is a groove provided between the inner wall of the frame and the side of the circuit board and between the first signal line and the second signal line.

3. The package according to claim 1, wherein the circuit board:
   has a rectangular shape comprising two corners opposed to the inner wall of the frame; and
   comprises a cutout at each of the two corners.

4. A mounting structure, comprising:
   the package according to claim 1; and
   an element disposed on the mounting region of the package.

5. The package according to claim 1, wherein
   the frame further comprises a first through hole and a second through hole from the inner wall to the outer wall.

6. The package according to claim 5, wherein
   the first connector is disposed in the first through hole, and
   the second connector is disposed in the second through hole.

* * * * *